United States Patent
Raymond

(10) Patent No.: US 10,897,807 B2
(45) Date of Patent: Jan. 19, 2021

(54) POWER SOURCE COOLING APPARATUS, METHOD, AND CONFIGURATION

(71) Applicant: The ESAB Group Inc., Florence, SC (US)

(72) Inventor: Andrew Raymond, Lebanon, NH (US)

(73) Assignee: The ESAB Group Inc., Florence, SC (US)

( * ) Notice: Subject to any disclaimer, the term of this patent is extended or adjusted under 35 U.S.C. 154(b) by 193 days.

(21) Appl. No.: 16/138,167

(22) Filed: Sep. 21, 2018

(65) Prior Publication Data

US 2020/0100351 A1     Mar. 26, 2020

(51) Int. Cl.
| | |
|---|---|
| *B23K 10/00* | (2006.01) |
| *H05H 1/28* | (2006.01) |
| *B23K 10/02* | (2006.01) |
| *H05H 1/36* | (2006.01) |

(52) U.S. Cl.
CPC .............. *H05H 1/28* (2013.01); *B23K 10/02* (2013.01); *H05H 1/36* (2013.01)

(58) Field of Classification Search
CPC ........ B23K 10/02; B23K 10/006; H05H 1/36; H05H 1/26; H05H 1/28
USPC ............ 219/121.49, 121.39, 121.45, 121.54, 219/121.57, 121.48
See application file for complete search history.

(56) References Cited

U.S. PATENT DOCUMENTS

| | | |
|---|---|---|
| 5,831,240 A | 11/1998 | Katooka et al. |
| 6,130,818 A | 10/2000 | Severson |
| 6,670,580 B2 | 12/2003 | Brofft et al. |
| 6,888,099 B1 | 5/2005 | Schneider |
| 6,912,128 B2 | 6/2005 | Bird et al. |
| 7,515,412 B2 | 4/2009 | Lee |
| 7,800,901 B2 | 9/2010 | Borowy et al. |
| 8,153,928 B2 | 4/2012 | Aubert et al. |
| 8,462,505 B2 | 6/2013 | Nagami et al. |
| 8,637,786 B2 | 1/2014 | Salsich et al. |

(Continued)

FOREIGN PATENT DOCUMENTS

| | | |
|---|---|---|
| EP | 3012058 A1 | 4/2016 |
| JP | H02-299779 A | 12/1990 |
| JP | 2002205186 A | 7/2002 |

OTHER PUBLICATIONS

Extended European Search Report from the European Patent Office for European Patent Application 19195730.7 dated Feb. 13, 2020, 9 pages.

(Continued)

*Primary Examiner* — Mark H Paschall
(74) *Attorney, Agent, or Firm* — Edell, Shapiro & Finnan, LLC

(57) ABSTRACT

A cooling component suitable for cooling an electrical component disposed in a power source of a welding or cutting system includes a heat transfer surface, an inlet, an outlet, and a closed flow area. The heat transfer surface transfers heat away from the electrical component. The inlet receives process gas from a gas source and the outlet directs the process gas downstream towards a torch assembly. The closed flow area extends between the inlet and the outlet and is in thermal communication with the heat transfer surface so that the process gas enhances cooling of the electrical component as the process gas travels through the closed flow area, from the inlet to the outlet.

20 Claims, 11 Drawing Sheets

(56) References Cited

U.S. PATENT DOCUMENTS

| | | |
|---|---|---|
| 8,729,422 B2 | 5/2014 | Bornemann |
| 8,859,928 B2 | 10/2014 | Sommerfeld |
| 9,050,684 B2 | 6/2015 | Sommerfeld |
| 9,120,182 B2 | 9/2015 | Bornemann |
| 9,474,185 B2 | 10/2016 | Jochman |
| 9,641,093 B2 | 5/2017 | Artelsmair et al. |
| 9,908,195 B2 | 3/2018 | Roberts et al. |
| 9,967,964 B2 * | 5/2018 | Kim .................. H05H 1/28 |
| 2005/0133201 A1 * | 6/2005 | Liu .................. H01L 23/427 |
| | | 165/80.5 |
| 2007/0210039 A1 * | 9/2007 | Griffin .............. H05H 1/28 |
| | | 219/121.54 |
| 2007/0268673 A1 * | 11/2007 | Ankireddi ........ H01L 23/3677 |
| | | 361/710 |
| 2008/0061046 A1 | 3/2008 | Borowy et al. |
| 2008/0061047 A1 | 3/2008 | Borowy et al. |
| 2008/0061048 A1 | 3/2008 | Borowy et al. |
| 2008/0219305 A1 | 9/2008 | Aubert et al. |
| 2010/0078410 A1 * | 4/2010 | Salsich ............ B23K 10/006 |
| | | 219/121.39 |
| 2010/0258534 A1 | 10/2010 | Hughes |
| 2010/0282728 A1 | 11/2010 | Cole |
| 2017/0034957 A1 | 2/2017 | Jochman |
| 2017/0312863 A1 | 11/2017 | Melius et al. |

OTHER PUBLICATIONS

Examination Report No. 1 for Australian Patent Application No. 2019226118 dated Jun. 11, 2020, 4 pages.

* cited by examiner

POWER SOURCE COOLING APPARATUS, METHOD, AND CONFIGURATION

TECHNICAL FIELD

The present disclosure is directed toward power sources for welding and/or cutting systems and, in particular, to an apparatus, method, and/or configuration for cooling one or more components disposed within a power source for a welding and/or cutting system.

BACKGROUND

Welding and cutting systems, such as plasma cutting systems, typically include multiple interconnected components. For example, a plasma cutting system may include a power source that interconnects a gas supply, a torch assembly, and a clamp. Then, during welding or cutting operations, electrical components (e.g., resistors, capacitors, integrated circuits, computing components (e.g., microprocessors), etc.) in the power source can be manipulated/controlled (e.g., in response to trigger signals, inputs at a control panel, etc.) to control a supply of gas and a supply of electricity to the torch assembly. However, these electrical components must be cooled properly in order to operate effectively, insofar as the term "cooled" or variations thereof, as well as the terms "heat," "heat transfer," and variations thereof, are used herein to indicate a transmission of power. For example, the phrase "electrical components must be cooled properly" may indicate that power must be transferred away from electrical components via a media (e.g., air, water, etc.) in order to maintain the electrical components at a suitable operational temperature.

Often, these electrical components are cooled by a subsonic flow of ambient air that is forced through the power source with a fan. For example, a fan may propel ambient air into contact with a heat sink that is in thermal communication with the electrical components disposed in a power source to transfer of heat away from the electrical components. Unfortunately, typically, cooling technologies that use forced subsonic flows (e.g., fan-propelled ambient air) have limited convection coefficients in the range of approximately 25-250 Watts per square meter for a temperature difference of one degree Kelvin ($W/m^2K$). Moreover, cooling electrical components with ambient air may introduce contaminants into the power source and, thus, the electrical components may need to be partitioned from a flow of ambient air. However, this partitioning may increase the weight of a power source, which is undesirable for at least power sources that are intended to be portable. In fact, a fan that forces ambient air into a power source may also increase the weight and/or cost of manufacturing of a power source and, unfortunately, it is difficult to reduce the weight and/or cost of a power source's fan may often without creating an undesirable decrease in the amount of cooling airflow that is introduced into the power source.

In some cases, force ambient airflows are replaced or enhanced with forced liquid cooling or phase change setups to increase the amount of cooling provided within a power source. Liquid cooling setups typically have convection coefficients in the range of approximately 100-20000 $W/m^2K$ and phase change setups typically have convection coefficients in the range of approximately 2500-100000 $W/m^2K$. Unfortunately, these technologies require yet additional components to be included in the power source and are much more expensive and complicated to implement as compared to forced subsonic flows. Thus, power source cooling configurations and/or apparatuses, as well as methods of cooling a power source, that improve cooling for the electrical components included in a power source while also minimizing or eliminating the weight and cost of manufacturing a power source are desired.

SUMMARY

The present disclosure is directed towards an apparatus and configuration for cooling a power source, as well as a method of cooling a power source.

According to one embodiment, the present disclosure is directed towards a cooling component suitable for cooling an electrical component disposed in a power source of a welding or cutting system. The cooling component includes a heat transfer surface, an inlet, an outlet, and a closed flow area. The heat transfer surface transfers heat away from the electrical component. The inlet receives process gas from a gas source and the outlet directs the process gas downstream towards a torch assembly. The closed flow area extends between the inlet and the outlet and is in thermal communication with the heat transfer surface so that the process gas enhances cooling of the electrical component as the process gas travels through the closed flow area, from the inlet to the outlet. Advantageously, this cooling component may cool electrical components to suitable temperatures without requiring cooling-specific components (e.g., components dedicated to cooling and not involved in operational undertakings of the power source, such as transferring power or process gas). Thus, power sources including the cooling component may be lighter and/or cheaper than power sources with cooling-specific components, such as fans or liquid flow paths. Alternatively, the cooling component may enhance the cooling provided by cooling-specific components without substantially increasing the weight and/or cost of a power source.

In some of these embodiments, the process gas is plasma gas, the torch assembly is a plasma arc torch assembly, and when the plasma gas reaches the plasma arc torch assembly, the plasma gas is ionized to create a plasma stream. Additionally or alternatively, the process gas may be the only media (e.g., gas, liquid, etc.) flowing through the closed flow area. Moreover, in some of these embodiments, the cooling component also includes one or more fins disposed in the closed flow area so that the process gas travels over the one or more fins when flowing from the inlet to the outlet to enhance the cooling of the electrical component.

In some embodiments, the cooling component comprises a heat sink including a base and heat sink fins that extend away from the base. In some of these heat sink embodiments, the closed flow area is formed in the base of the heat sink. For example, the closed flow area may be formed as the heat sink is manufactured or formed after the heat sink is manufactured (e.g., a heat sink may be, in essence, retrofitted to include the closed flow area). As a more specific example, in some instances, the closed flow area is formed in a cavity defined by the base, and the cooling component further comprises a cover that seals the cavity to define the closed flow area. Alternatively, in some of these heat sink embodiments, the closed flow area is formed by a cover that defines an internal volume with an outer surface of the base. For example, the cover and the base may enclose at least one of the heat sink fins within the internal volume. If the closed flow area is formed in the base, the inlet and the outlet may also be formed in the base of the heat sink. Meanwhile, if the closed flow area is formed with a cover, the inlet and the outlet may be formed in the cover. Thus, the closed flow area may be included on a variety of heat sinks, of varying shapes and sizes. Notably, if heat sink fins are enclosed within the closed flow area, these fins may serve to enhance cooling in the same manner as the one or more fins mentioned above.

According to another embodiment, the present disclosure is directed towards a power source for a welding or cutting system including an external housing, electrical components disposed within the external housing, and a cooling component positioned within the external housing in a position that receives heat generated by at least one of the electrical components. The cooling component includes an inlet for receiving process gas from a gas source, an outlet that directs the process gas downstream towards a torch assembly, and a closed flow area. The closed flow area directs the process gas from the inlet to the outlet so that the process gas enhances cooling of the at least one electrical component as the process gas travels through the closed flow area, from the inlet to the outlet.

In some of these embodiments, the external housing includes a housing outlet configured to receive the process gas from the outlet of the cooling component and deliver the process gas to the torch assembly. Additionally or alternatively, the gas source may be external to the power source and the external housing may include a housing inlet configured to receive the process gas from the gas source and deliver the process gas to the inlet of the cooling component.

According to another embodiment, the present disclosure is directed towards a method of cooling components in a power source for a welding or cutting system. The method includes forming a gas flow passage in thermal connection with heated components in the power source and directing process gas through the flow passage as the process gas flows towards a torch assembly. In at least some embodiments, the directing occurs during welding or cutting operations of the welding or cutting system. This eliminates risks associated with detecting a rise in temperature and also conserves energy because electrical components do not experience a relatively extreme rise in temperature between cooling cycles. Instead, when the electrical components are generating heat (e.g., during operation of the power source), cooling is provided.

BRIEF DESCRIPTION OF THE SEVERAL VIEWS OF THE DRAWINGS

Like numerals identify like components throughout the figures.

DETAILED DESCRIPTION

Figure 1:
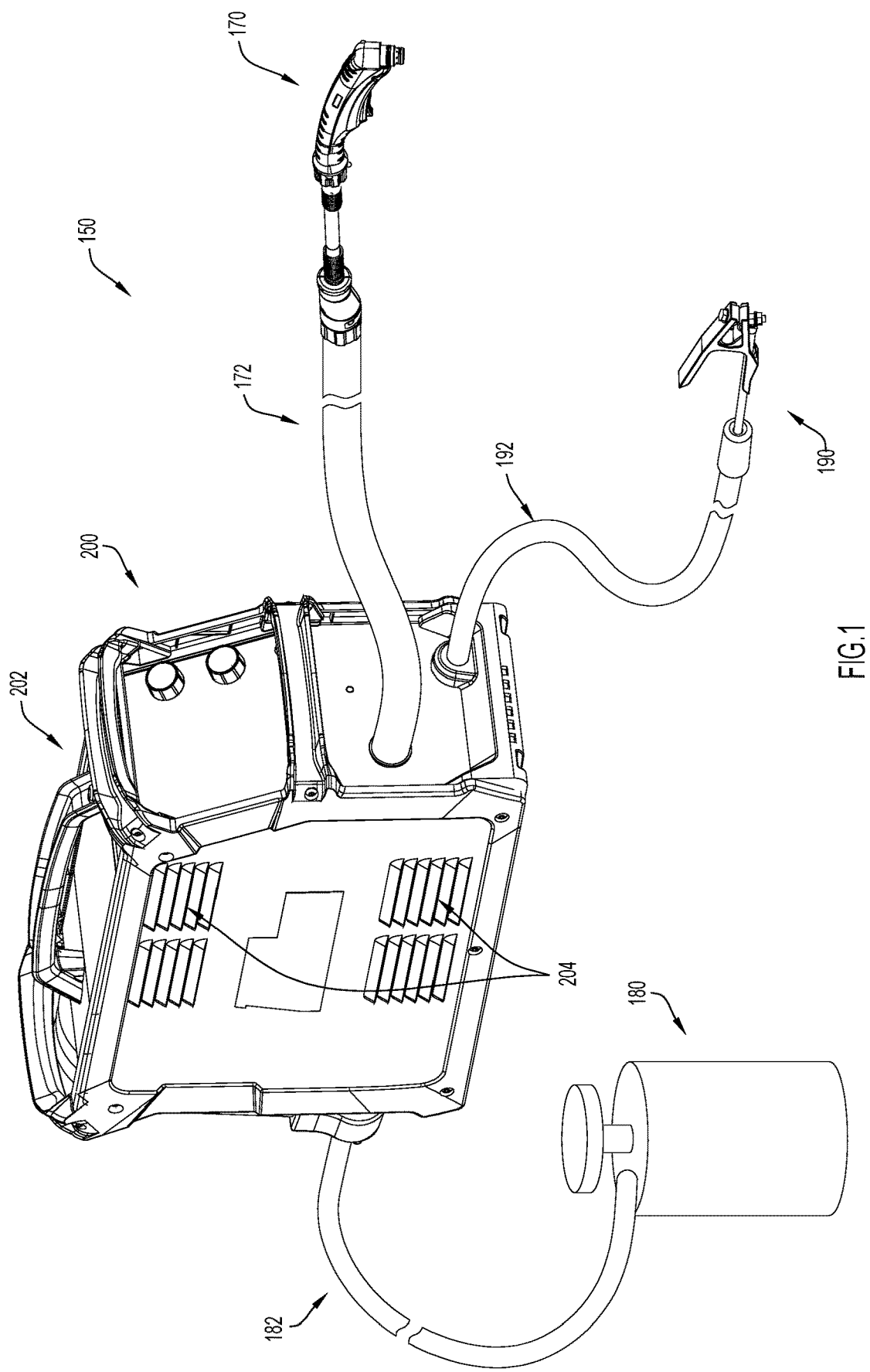
FIG. 1 is a perspective view of a cutting system including a gas supply and a torch assembly that are connected, via cable hoses, to a power source including a cooling configuration formed in accordance with an embodiment of the present disclosure.

An apparatus, configuration, and method for cooling components of a power source are presented herein. The apparatus, configuration, and method direct process gas (i.e., operational gas), such as plasma gas, over and/or through heat transfer surfaces/objects in a power source to cool electrical components (e.g., resistors, capacitors, integrated circuits, computing components (e.g., microprocessors), etc.) included in the power source. That is, power source components typically used to deliver process gas to a torch assembly are modified/replaced so that the process gas travels over and/or through heat transfer surfaces in the power source as it moves from the power source's gas inlet port to the power source's gas outlet port. Consequently, the apparatus and configuration provide cooling without adding cooling-specific components to a power source. Moreover, the cooling provided by the process gas provides efficient cooling and, thus, can replace or enhance cooling provided by ambient airflow, liquid, and/or phase change configurations. In fact, in at least some embodiments, cooling-specific components, such as fans, can be removed from a power source and/or replaced with smaller and/or cheaper components. For example, a power source incorporating the cooling apparatus/configuration presented herein may not need a fan to force a flow of ambient air through the power source. Consequently, the cooling apparatus/configuration presented herein may reduce the cost, weight, and/or electrical consumption of a power source while still providing any electrical components included in the power source with sufficient cooling.

Since the apparatus and configuration presented herein utilize process gas for cooling, the power source may not need to include components dedicated solely to cooling the power source (e.g., liquid flow paths, heat pipes, bonding agents, fans, etc.). That is, the power source need not add cooling-specific components to a power source and may utilize components that exists in nearly all power sources (e.g., heat sink and pipes for process gas) to generate effective cooling. Moreover, a power source including the cooling configuration presented herein need not pass a second media (e.g., gas, liquid, etc.) through the power source to provide cooling.

By comparison, liquid cooling and phase change cooling can only be implemented by adding (e.g., installing/including) cooling-specific components to a power source, insofar as cooling-specific components are dedicated to cooling and not directly involved in operational undertakings of the power source (e.g., transferring gas and electricity to a torch assembly). For example, liquid cooling requires a power source to include or define closed flow paths dedicated to passing a flow of liquid (e.g., water) through the power source. Meanwhile, a power source utilizing phase change cooling may require one or more heat pipes with an internal fluid that evaporates at a low temperature (to pull energy away from a heat sink/electrical component) to be bonded to a heat sink or heat transfer surface with a specific gap filler or bonding agent (e.g., a bonding agent that increases the resistance of the thermal bonded joint and slows the conduction of heat from the heat sink/heat transfer surface to the heat pipe).

FIG. 1 illustrates an example embodiment of cutting system 150 including a power source 200 with a process gas cooling configuration 201 (see FIGS. 2 and 3) formed in accordance with an embodiment of the present disclosure. At a high-level, the power source 200 supplies power to a torch assembly 170 while also controlling the flow of gas from a gas supply 180 to the torch assembly 170 (however, in other embodiments, the power source 200 might supply the gas itself). The gas supply 180 is connected to the power source 200 via cable hose 182 and the power source 200 is connected to the torch assembly 170 via cable hose 172. The cutting system 150 also includes a working lead 192 with a grounding clamp 190. As is illustrated, cable hose 172, cable hose 182, and/or cable hose 192 may each be any length. In order to connect the aforementioned components, the opposing ends of cable hose 172, cable hose 182, and/or cable hose 192 may each be coupled to the power source 200, torch assembly 170, gas supply 180, or clamp 190 in any manner now known or developed hereafter (e.g., a releasable connection).

Figure 2:
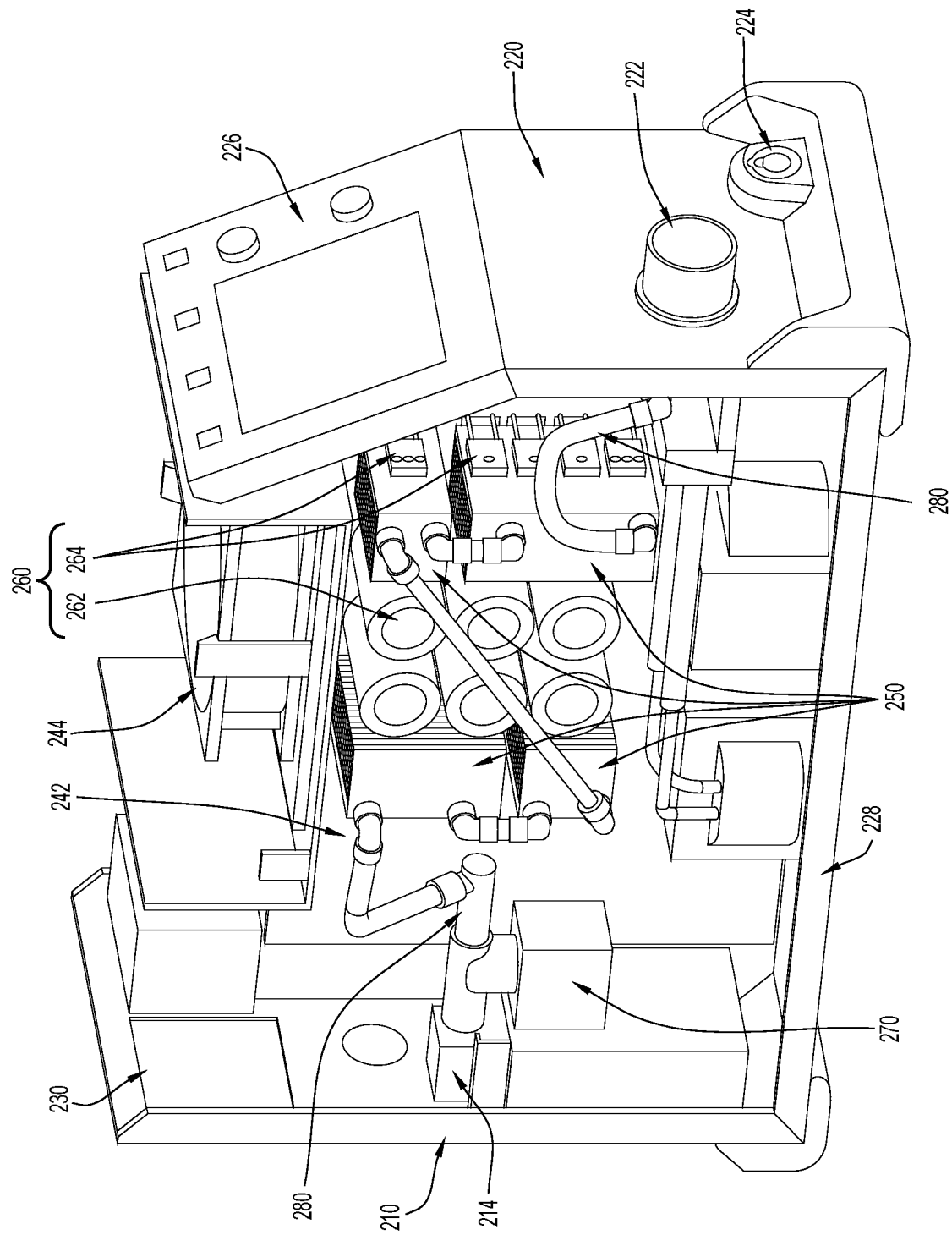
FIG. 2 is a side perspective view of the power source of FIG. 1 with an external cover of the power source removed.
Figure 3:
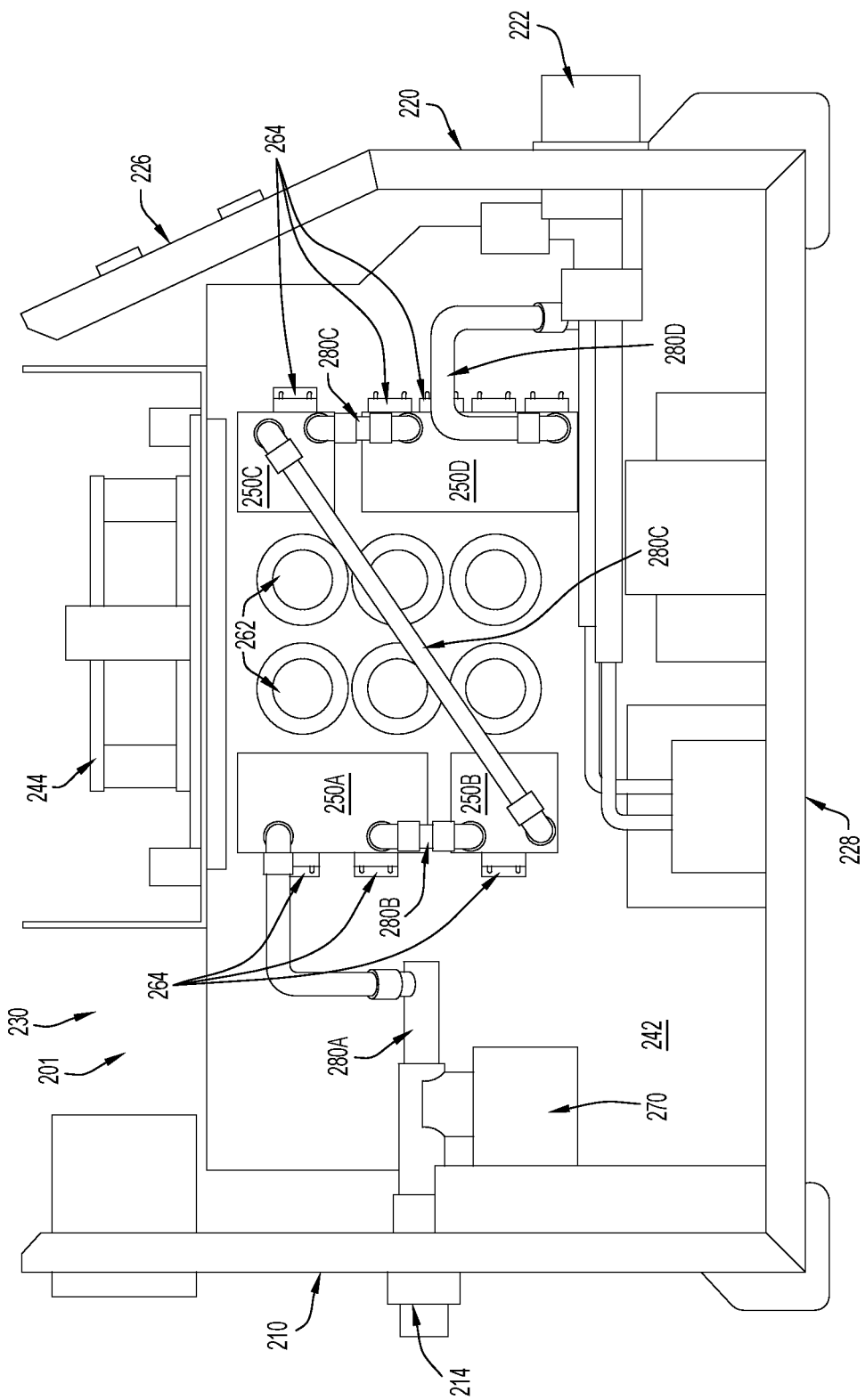
FIG. 3 is a side view of the power source of FIG. 1 with its external cover removed.

Still referring to FIG. 1, but now together with FIGS. 2 and 3, generally, in the depicted embodiment, the process gas cooling configuration 201 utilizes compressed process gas from the gas supply 180 to cool various electrical components in the power source 200 as the compressed process gas flows through the power source 200, from the gas supply 180 to the torch assembly 170. More specifically, first, the compressed process gas flows from the gas supply 180 to the power source 200 via cable hose 182. Then, the compressed gas flows through a closed flow path 280 that extends from a gas inlet port 214 included on a back wall 210 of the power source 200 to an outlet port 222 included on a front wall 220 of the power source 200 while passing through/over heat sinks 250 included in the power source 200 (the flow rate may be controlled at the inlet 214 by a flow controller 270, such as a solenoid valve assembly). When the compressed process gas reaches the port 222 included on the front wall 220, the compressed process gas is directed to the torch assembly 170 via cable hose 172. Notably, for the purposes of this description, port 222 is largely described with respect to gas transfer of a single gas; however, it is to be understood that port 222 may also allow the power source 200 to transfer additional gasses and/or electricity to the torch assembly 170 via cable hose 172. By comparison, the front 220 also includes a port 224 for the cable hose 192 that connects the working clamp 190 to the power source 200 and, typically, port 224 only provides an electrical connection and is unrelated to gas flow.

In the depicted embodiment, the compressed process gas is plasma gas and, thus, once the compressed process gas reaches the torch assembly 170, the compressed process gas is directed through an arc in the torch assembly 170 to generate a stream of plasma. However, in other embodiments, the cooling configuration 201 presented herein might also be used in welding systems, automated cutting systems, and/or any other system in which electrical components require cooling and operational gas is flowing from a power source to a torch. That is, the cooling apparatus and configuration presented herein may be useful in power sources suitable for various types of welding or cutting. In these other embodiments, the process gas might be any gas utilized during welding or cutting operations and need not necessarily be compressed gas. For example, in some embodiments, the process gas might be shielding gas. That being said, using compressed process gas will also take advantage of the throttling effect of compressed gasses expanding and cooling. This will create a larger temperature differential between the cooler compressed gas and the higher temperature of heated surfaces which will drive higher convection cooling. However, regardless of the type of process gas used, the process gas is the only media that travels through the cooling configuration 201; no water, other liquids, or other gasses pass therethrough.

Still referring to FIGS. 1-3, in the depicted embodiment, the power source 200 includes a fan 244 (see FIGS. 2 and 3) and the process gas cooling configuration 201 enhances cooling provided by forced subsonic airflow created by the fan 244. To facilitate airflow for the fan 244, a cover 202 that defines at least a portion of an exterior housing of the power source 200 includes vents 204 (the top vents 204 may serve as an inlet and the bottom vents 204 may serve as an outlet). However, in other embodiments, the process gas cooling configuration 201 may replace a forced subsonic airflow system and, in these embodiments, the power source 200 might not include vents 204 in its exterior housing.

In FIGS. 2 and 3, the power source 200 is illustrated with the cover 202 removed. As can be seen, in the depicted embodiment, the cover 202 defines sides and a top of the power source 200 so that the cover 202, the back 210, and the front 220 can cooperate with a bottom 228 to form an exterior housing that defines an interior cavity 230. The interior cavity 230 houses various electrical components and the process gas cooling configuration 201 (at a minimum). More specifically, in the depicted embodiment, the interior cavity 230 houses a printed circuit board (PCB) 242 that extends perpendicularly upwards from the bottom 236 (e.g., parallel to the sides of the power source 200 defined by the cover 204) and various electrical components 260 are mounted, either directly or indirectly, to the PCB 242. That is, the power source 200 may include electrical components 262 (e.g., capacitors) mounted directly to the PCB 242 and/or electrical components 264 mounted to heat sinks 250 (e.g., with a thermal interface) and, despite these different mountings, electrical components 262 and 264 may each be operatively coupled to the PCB 242 and may be operative to control the supply of electricity and/or gas to a torch assembly (e.g., torch assembly 170) based on commands/signals received by the power source 200 (e.g., commands received at a control panel 226 included on the power source 200).

In the depicted embodiment, the closed flow path 280 defined by the process gas cooling configuration 201 extends through each of the heat sinks 250 included in power source 200 in series. More specifically, in the depicted embodiment, the power source 200 includes four heat sinks 250: a first heat sink 250A; a second heat sink 250B; a third heat sink 250C; and a fourth heat sink 250D. Each of the heat sinks 250 are arranged so that fins (e.g., extruded/machined surfaces) are disposed in or adjacent the flow path of the subsonic airflow generated by the fan 224. That is, the fins of heat sinks 250A and 250B extend towards the front 220 (and towards the electrical components 262) while the fins of heat sinks 250C and 250D extend towards the back 210 (and towards the electrical components 262). Meanwhile, electrical components 264 are mounted on the bases of the heat sinks 250 (e.g., the sides of the heat sinks 250 from which the fins extend away, so that the electrical components 264 are disposed on a back of the heat sinks 250). The bases of the heat sinks 250 may serve as heat transfer surfaces for heat generated by electrical components 264. As is explained in further detail below, each of the heat sinks 250 includes or defines a closed flow area (e.g., a closed pathway) that allows compressed process gas to flow through or over each of the heat sinks 250. These closed flow areas (e.g., pathways) are connected by segments of pipe and, cooperate with the pipes to define the closed flow path 280.

More specifically, in the depicted embodiment, the closed flow path 280 includes five pipe segments that extend between the heat sinks 250, the gas inlet 214, and the gas outlet 222. A first pipe segment 250A extends from the gas inlet 214 to the first heat sink 250A and allows gas received from the gas supply 180 to flow into a passageway in the first heat sink 250A (the passageway is described in further detail below). When the gas exits the first heat sink 205A, it flows through a second pipe segment 280B and into the second heat sink 250B. The gas then flow through a third segment 280C, a third heat sink 250C, a fourth pipe segment 280C, and a fourth heat sink 250D, in that order. Upon exiting the fourth heat sink 250D, the gas flows through a fifth and final segment 280D (also referred to as exit segment 280D) to the gas outlet 222, where the gas may be directed towards torch assembly 170 via cable hose 172. Since the gas flows through the heat sinks sequentially (e.g., one after another), the heat sinks 250 may be referred to as being arranged in series. However, in other embodiments, the heats sinks 250 may be arranged in parallel (e.g., a pipe segment may split and deliver gas to two or more heat sinks simultaneously), series, or some combination thereof.

Now turning to FIGS. 4-8, generally, these figures illustrate heat sinks that are suitable for the cooling configuration presented herein. That is, the heat sinks illustrated in FIGS. 4-8 define closed flow areas that allow a process gas to flow over and/or through the heat sink. As is described in further detail below, in the embodiment depicted in FIGS. 4, 5A, and 5B the closed flow area is formed within the heat sink while in the embodiment depicted in FIGS. 6-8 the closed flow area is formed on/over a portion of the heat sink. However, heat sinks are not the only component through/over which a process gas may be directed to enhance cooling of electrical components in a power source in accordance with the present disclosure. For example, a heat plate or any other component that can transfer heat away from an electrical component (e.g., any component with a heat transfer surface for transferring heat away from the electrical component) may include the closed flow area described herein that allow a process gas to flow over and/or through. That being said, each of the embodiments depicted in FIGS. 4-8 is described in turn below.

Figure 4:
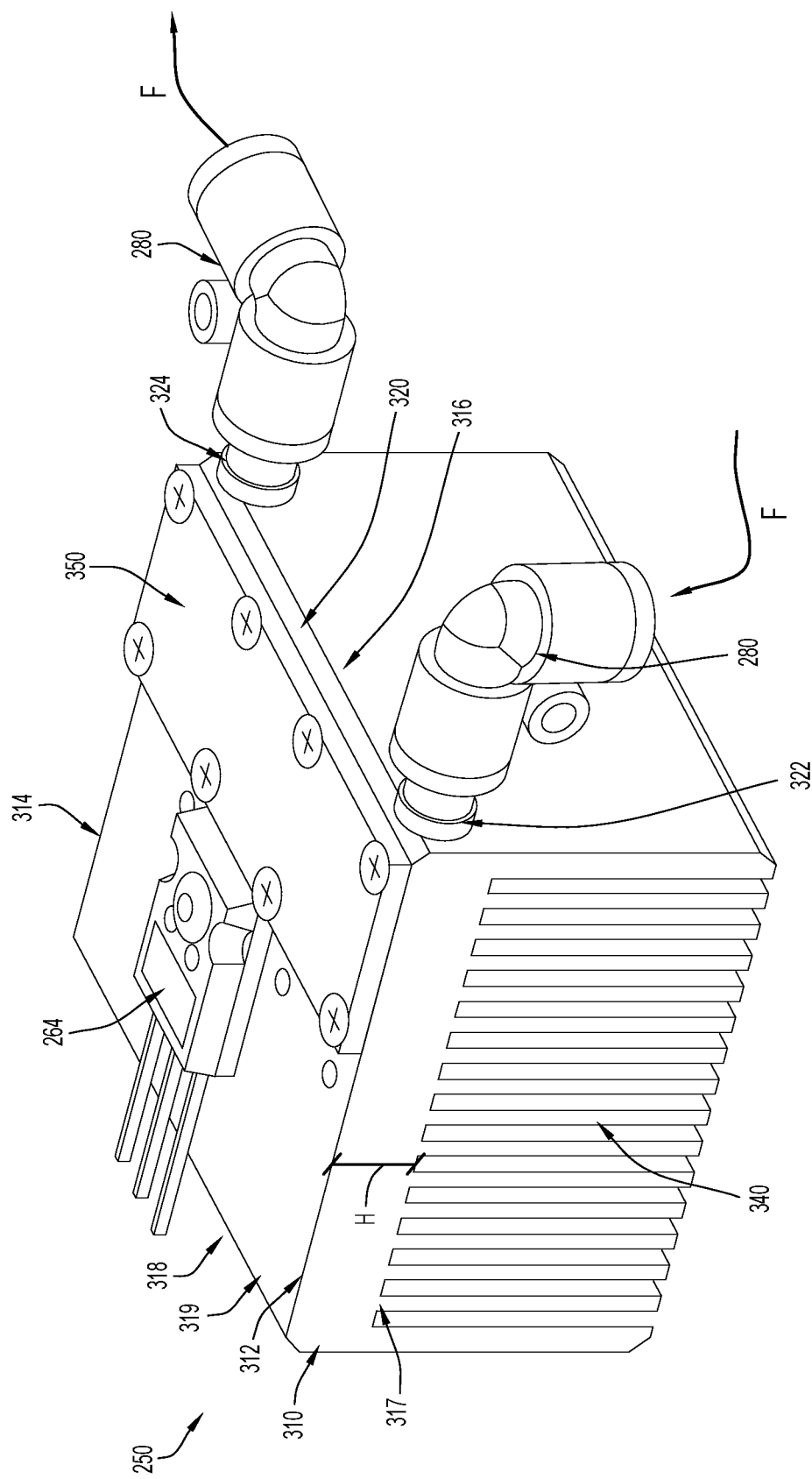
FIG. 4 is a perspective view of a heat sink included in the cooling configuration of the power source of FIG. 1.
Figure 5B:
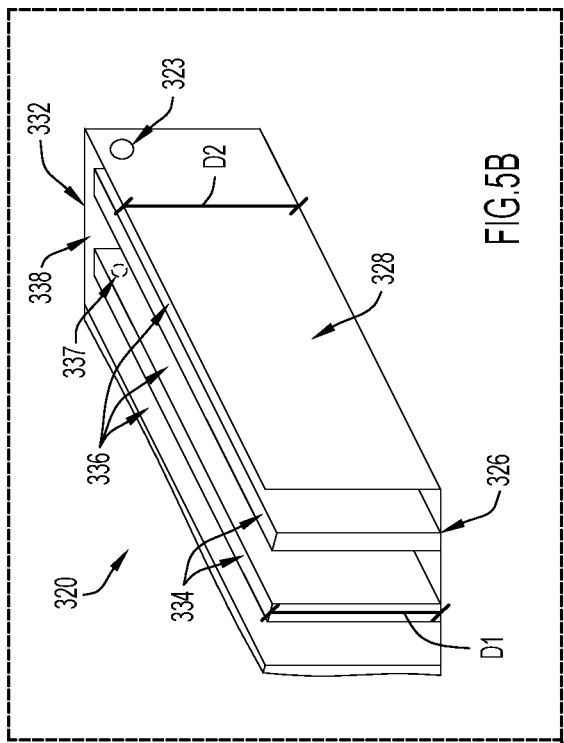
FIG. 5B is a detail view of a portion of the heat sink illustrated in FIG. 5A.
Figure 5A:
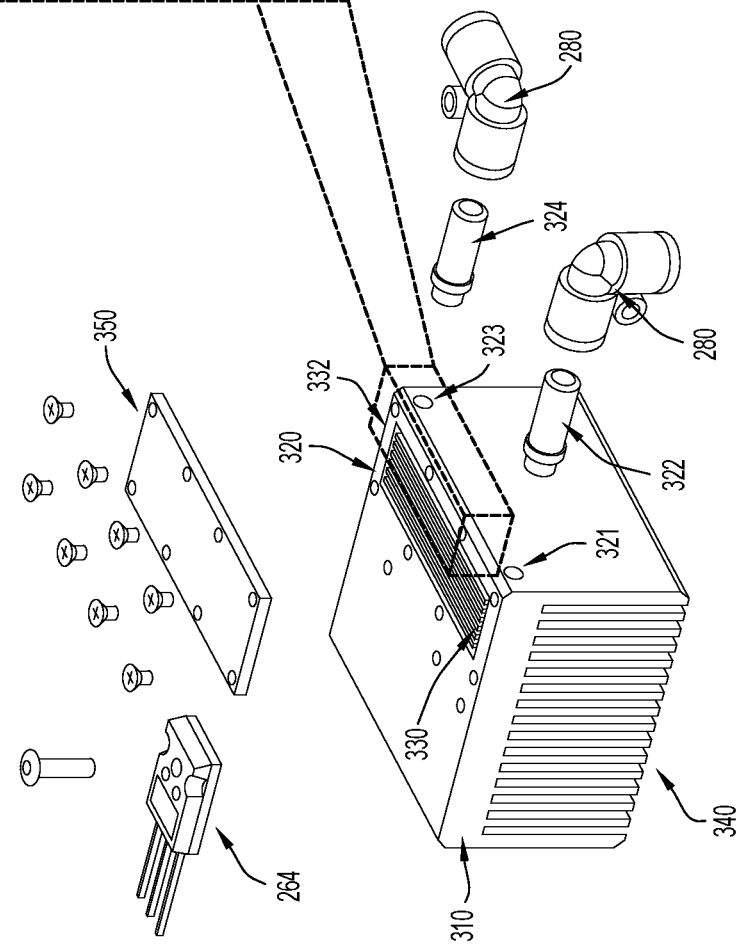
FIG. 5A is an exploded view of the heat sink illustrated in FIG. 4.

First, FIGS. 4, 5A, and 5b illustrate a first embodiment of a heat sink 250 suitable for the cooling configuration illustrated in FIGS. 2 and 3. The heat sink 250 includes a base 310, a set of fins 340 that extend away from the base, and a flow area 320 (also referred to as a gas flow passage 320) that is formed in the base 310. More specifically, the base 310 extends from a front 312 to a back 314 and between a first side 316 and a second side 318. The base 310 also includes a bottom 317 and a top 319 that are separated by a height "H." The fins 340, which may be extruded or machined surface, extend from the bottom 317 of the base 310 and are each parallel to the sides 316, 318 of the base 310. Meanwhile, the flow area 320 is formed within the base 310 (e.g., in a space between, but inclusive of: (1) the front 312 and back 314; (2) the top 319 and the bottom 317; and (3) the first side 316 and the second side 318).

In the depicted embodiment, the flow area 320 extends from the top 319 of the base 310 towards the bottom 317 of the base 310, but does not extend through the bottom 317. Instead, the base 310 defines a bottom 326 of the internal flow area 320, as can be seen in FIG. 5B. That is, in the depicted embodiment, the internal flow area 320 extends from the top 319 of the base 310 and has a depth "D2" that is less than the height "H" of the base 310. The base 310 also defines sidewalls 328 of the internal flow area 320, but in the depicted embodiment, does not define a top of the flow area 320. Instead, a cover 350 is secured to the top 319 of the base 310, over the flow area 320 in order to enclose the flow area 320. For example, in some embodiments, the flow area may be formed by removing (e.g., via milling or other such machining techniques) portions of the base 310 to form the flow area 320 and, then, a cover 350 may be secured over the flow area 320 with fasteners (e.g., screws) or a fastening agent (e.g. epoxy, glue, etc.).

However, in other embodiments, the flow area 320 may be formed within the base 310 in any desirable manner. For example, in some embodiments, the heat sink 250 might be formed with additive manufacturing techniques and, thus, the flow area 320 might be formed within the base 310 as the base 310 is formed. In these embodiments, the base 310 might also cover the flow area 320, rendering the cover 350 unnecessary. Moreover, in some embodiments, the flow area 320 may be formed within the base 310 adjacent any side or portion of the heat sink 250 (e.g., portions of side 316, side 318, bottom 317, front 312, back 314, corners or edges extending therebetween, etc.), by removing material or in any other manner. Still further, in embodiments including relatively large fins 340, the flow area 320 could also be formed within one of the fins, whether by removing material or in any other manner.

Regardless of how the flow area 320 is formed within the heat sink 250, the flow area 320 is closed or sealed, except for an inlet 321 that is disposed adjacent one of the front 330 or back 332 of the flow area 320 and an outlet 323 that is disposed adjacent the other of the front 330 or back 332 of the flow area 320. For example, in the depicted embodiment, inlet 321 extends through the side 316 of the base 310 adjacent the front 330 to provide a conduit into the flow area 320 and outlet 323 extends through the side 316 of the base 310 adjacent the back 332 to provide a conduit out of the flow area 320. Fittings 322 and 324 can be mounted in the inlet 321 and outlet 323, respectively, to securely connect pipe segments 280 to the inlet 321 and outlet 323 so that process gas flowing through the closed flow path 280 in a power source 200 can flow into and out of a heat sink 250 without any leaks.

In some embodiments, the flow area 320 may also include cooling enhancement features, such as extruded fins 334 (referred to herein as flow area fins 334 simply to provide clarity with respect to the fins 340 of the heat sink 250, to which fins 334 are similar); however, in other embodiments, the flow area 320 need not include any cooling enhancement features and may simply be an unobstructed conduit of any shape or size. That is, the flow area might simply be a channel or conduit with a square, circular, irregular, etc. cross-sectional shape. In the depicted embodiment, the flow area 320 includes rectangular flow area fins 334 that define cooling channels 336 within the flow area 320. To enhance side-to-side flow between the cooling channels 336, the flow area fins 334 may have a height "D1" that is less than the height D2 of the flow area 320 so that a space 338 spanning the width of the flow area 320 is provided at the top of the flow area 320, insofar as the width is the dimension spanning the two sidewalls 328 of the flow area 320 (notably, only one sidewall 328 is shown in the detail view of FIG. 5B). Additionally or alternatively, the flow area fins 334 may include one or more crossflow openings 337 and/or the flow area fins 334 might not span the entire length of the flow area 320, insofar as the length is the dimension spanning from the front 330 to the back 332 of the flow area 332. For example, the fins 334 might include gaps or breaks adjacent the front 330, the back 332, and/or any areas there between.

Still referring to FIGS. 4, 5A, and 5B, in the depicted embodiment, electrical component 264 is mounted atop of top 319 of the base 310, but out of alignment with the flow area 320 (and the cover 350). Thus, the top 319 serves as a heat transfer surface of the heat sink 250 and draws heat away from the electrical component 264. However, in other embodiments, the electrical component 264 might be mounted to any surface of the heat sink and that surface may serve as the heat transfer surface of the heat sink component. For example, in some embodiments, the electrical component 264 may be mounted to the heat sink 250 atop the cover 350 so that the electrical component 264 is mounted directly above the flow area 320. In some instances (e.g., depending on the amount of thermal conduction between the cover 350 and the remainder of the heat sink 250), aligning the electrical component 264 atop the cover 350 may increase the amount of cooling provided to the electrical component 264. In fact, it may be particularly desirable to mount the electrical component 264 atop the flow area 320 if the flow area 320 is formed within the base 310 without creating an opening in the top 319 (e.g., if the flow area is formed with additive manufacturing) at least because a portion of the top 319 may have increased thermal conduction with the remainder of the heat sink 250 as compared to a cover 350. On the other hand, if the flow area 320 is formed in a heat sink 250 after the electrical component 264 is mounted to the heat sink 250 (e.g., if the cooling configuration is retrofitted onto a power source with an existing cooling configuration), the flow area 320 may be offset from the electrical component 264 to avoid removing and remounting the electrical component 264. Regardless of where the electrical component 264 is mounted to the heat sink 250, the electrical component 264 may be mounted to the heat sink 250 (e.g., to the top 319) with a thermal interface to ensure heat dissipates from the electrical component 264 to the heat sink 250 efficiently.

Figure 6:
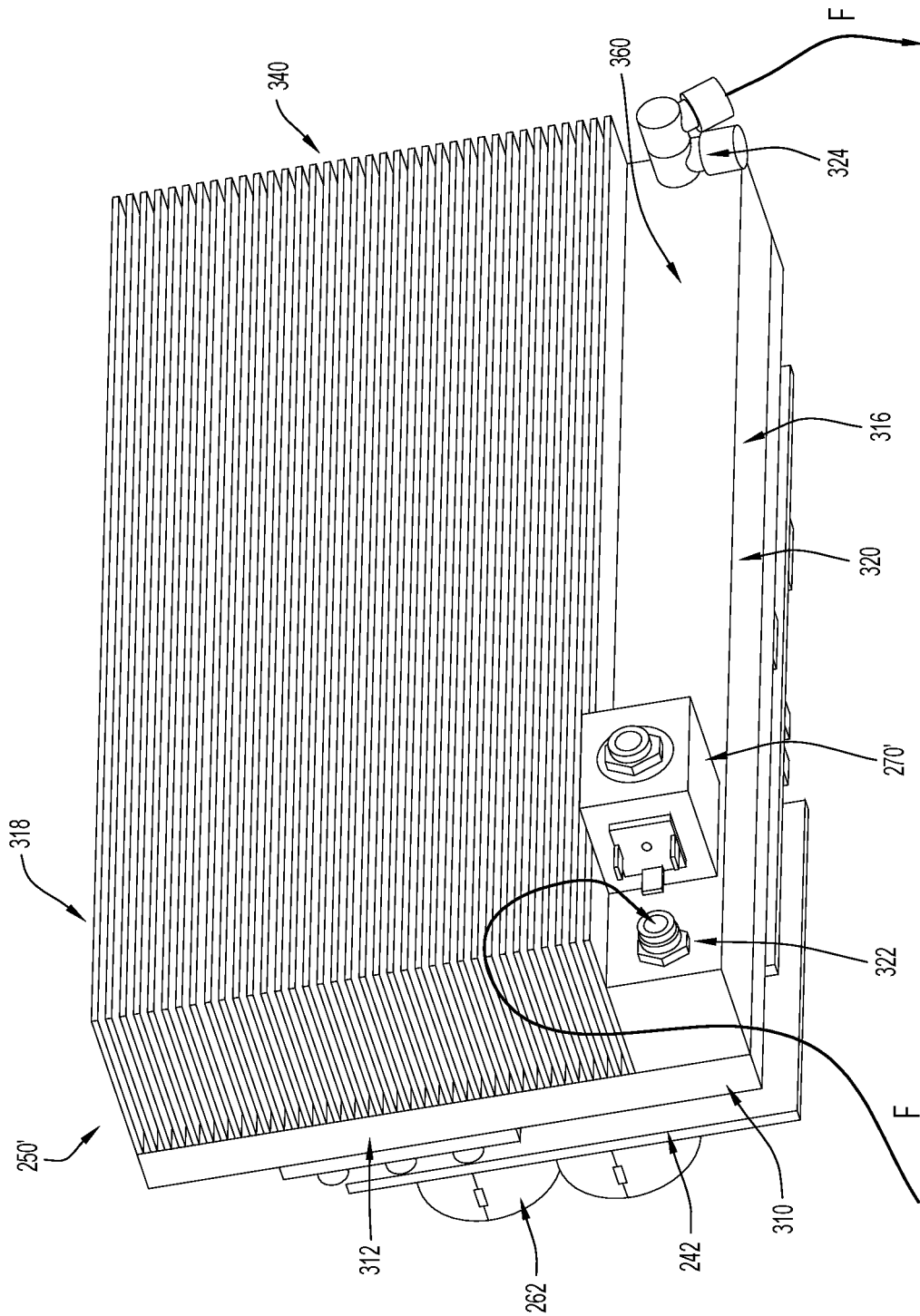
FIG. 6 is a perspective view of a heat sink that may be included in a cooling configuration, according to another embodiment of the present disclosure.
Figure 7:
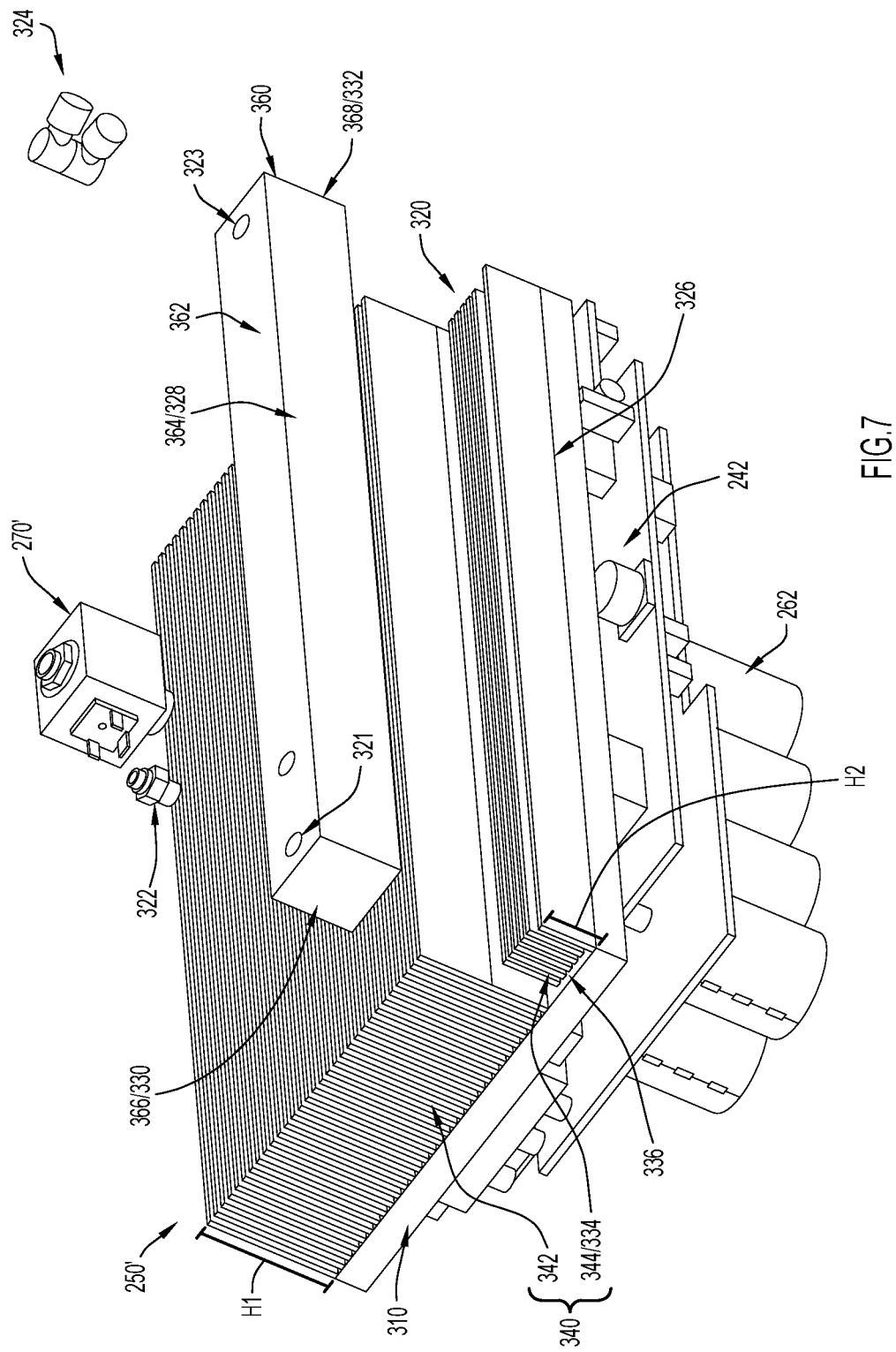
FIG. 7 is an exploded view of a first embodiment of the heat sink that is illustrated in FIG. 6.

Now turning to FIGS. 6 and 7, these figures illustrate a second embodiment of a heat sink 250' suitable for a cooling configuration that can be implemented with or in place of the cooling configuration illustrated in FIGS. 2 and 3. In fact, in FIGS. 6 and 7, the heat sink 250' is shown mounted on a back side of the PCB 242 from FIGS. 2 and 3, insofar as the back side of the PCB 242 is the side of the PCB opposite to the side on which electrical components 262 are mounted. Thus, in some embodiments, heat sink 250' could be used in place of heat sinks 250 and the flow path 280 could run solely along the back side of the PCB 242 (and through the heat sink 250'), but in other embodiments, the heat sink 205' could be installed in the power source 200 in addition to the heat sinks 250. In the latter scenario, the flow path 280 splits so that some process gas is directed through heat sinks 250 and the remainder (e.g., approximately half) of the process gas is directed through heat sink 250'. That is, heat sink 250' might be installed in parallel to the heat sinks 250.

Regardless of how the heat sink 250' is implemented, the heat sink 250' is similar to the heat sink 250 illustrated in FIGS. 4, 5A, and 5B insofar as heat sink 250' includes a base 310, a set of fins 340 that extend away from the base 310, and a flow area 320. However, in contrast with heat sink 250, the flow area 320 of heat sink 250' is formed over a portion of the fins 340, instead of within the base 310. More specifically, the fins 340 include a first set of fins 342 and a second set of fins 344. The fins in the first set 342 have a height "H1" and the fins in the second set 344 have a height "H2" that is smaller than H1. That is, the first set of fins 342 extend further from the base 310 of the heat sink 250' than the second set of fins 344. Consequently, open space is provided above and around the second set of fins 344 and this space can be used to form the gas flow area 320 and to mount any associated parts (e.g., fittings, gas flow controllers, etc.). In the depicted embodiment, this space provides room for a cover 360 to be secured over at least a portion of the second set of fins 344 (in any manner now know or developed hereafter) and form the gas flow area 320 over, around, and/or between the second set of fins 344.

The cover 360 includes sides 364 and a top 362 that extend between a front 366 and a back 368. The sides 364, front 366, and back 368 extend downwards, perpendicularly away from the top 362 and, in the depicted embodiment, enclose all of the fins in the second set of fins 344 between the cover 360 and the base 310. However, in other embodiments, any portion of the second set of fins 344 might be enclosed between the cover 360 and the base 310. More specifically, in FIGS. 6 and 7, the front 366 of the cover 360 defines a front 330 of the flow area 320, the back 368 of the cover 360 defines a back 332 of the flow area 320, and the sides 364 of the cover 360 define sidewalls 328 of the flow area 320. That is, the cover 360 and base 310 form a closed flow area 320 substantially similar to the flow area 320 illustrated in FIGS. 5A, and 5B and, thus, any description of the flow area 320 of FIGS. 4, 5A, and 5B included above should be understood to apply to the flow area 320 depicted in FIGS. 6 and 7. For example, although the second set of fins 344 serve as flow area fins 334 (i.e., fins that enhance cooling in the flow area 320) in the embodiment depicted in FIGS. 6 and 7, fins 344 may be substantially similar to the flow area fins 334 that are formed in the flow area 320 of FIGS. 4, 5A, and 5B.

One difference between the flow area shown in FIGS. 4, 5A, and 5B and the flow area 320 depicted in FIGS. 6 and 7 is that the inlet 321 and outlet 323 are disposed atop the flow area 320, instead of through a side 328 of the flow area 320. Consequently, the flow area 320 may not need features that enhance side-to-side flow within the flow area 320, such as holes 337 or a cross-flow area 338. Nevertheless, if desired, the fins 334 and/or the cover 360 shown in FIGS. 6 and 7 may define features that enhance side-to-side flow, such as holes 337 or a cross-flow area 338 (despite FIGS. 6 and 7 not illustrating these features). One other difference between the embodiment of FIGS. 4, 5A, and 5B and the embodiment of in FIGS. 6 and 7 is that, the heat sink 250' depicted in FIGS. 6 and 7 includes a flow controller 270' (e.g., a solenoid valve assembly) mounted adjacent its inlet 321. As is described in further detail below, flow controller 270' may be configured to control the amount of gas flowing through flow area 320 (as opposed to the amount of gas flowing through an entire closed flow pathway 280).

Figure 8:
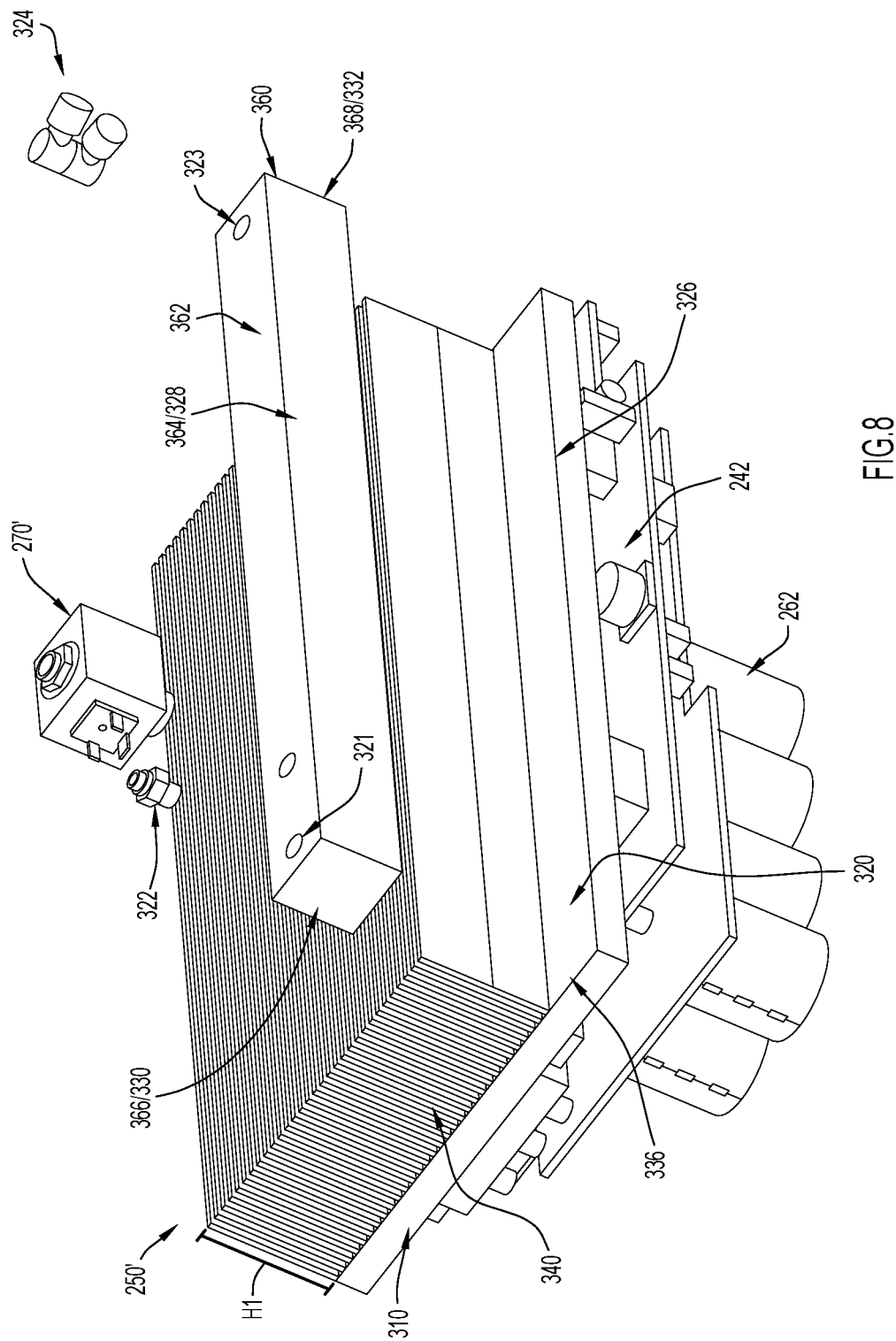
FIG. 8 is an exploded view of a second embodiment of the second heat sink that is illustrated in FIG. 6.

Now turning to FIG. 8, this Figure illustrates a third embodiment of a heat sink 250" that is substantially similar to heat sink 250', except that heat sink 250" does not include two sets of fins. Instead, the base 310 extends beyond its fins 340 or, from another perspective, the heat sink 250" includes fins 340 that only span a portion of the base 310. Either way, a portion of the bottom 326 of the base 310 is exposed (when viewed from the bottom) and provides an area on which cover 360 can be mounted to form a flow area 320 extending across the heat sink 250. Thus, in the embodiment depicted in FIG. 8, the flow area 320 does not include any internal flow area fins 334. Otherwise, the embodiment depicted in FIG. 8 may be substantially similar to the embodiment depicted in FIGS. 6-7 and any description of the embodiment of FIGS. 6-7 should be understood to apply to the embodiment depicted in FIG. 8. However, it should be noted that the embodiment depicted in FIG. 8 is merely one example of a flow area 320 formed without any cooling enhancement features (e.g., fins) and in various embodiments, similar unimpeded flow areas might formed on any surface (flat, rounded, or irregular) of a cooling component.

Referring generally to FIGS. 1-8, in some embodiments, a heat sink, such as heat sink 250' may include a flow controller dedicated to that heat sink to control the amount of gas flowing into the inlet 321 of the flow area 320. For example, in the embodiments depicted in FIGS. 6-8, a flow controller 270' is mounted to cover 360 adjacent fitting 322 and controls an amount of gas flowing through the fitting 322 into the inlet 321. This flow controller 270' may be included in addition to or in lieu of the flow controller 270 shown in FIGS. 2 and 3 (which controls gas flow entering the closed flow path 280 at the inlet 214 of the power source 200).

For example, in embodiments that include a plurality of heat sinks 250 installed on a first side of a PCB 242 and another heat sink 250' installed on an opposite side of the PCB 242, flow controller 270 may control the flow of gas into closed flow path 280 (from the gas supply 180) and flow controller 270' may determine what portion or percentage of that flow of gas is diverted to the heat sink 250' (as compared to heat sinks 250). That is, the entry segment 280A of the closed flow path 280 may have a split or fork and the flow controller 270' may control an amount of gas that flows down a first pathway of the split (and into/onto heat sink 250') and gas not flowing down the first pathway may flow down a second pathway. The gas flowing along the second pathway may flow through the heat sinks 250. For example, in the depicted embodiments, the gas flowing along the second pathway flows sequentially through the heat sinks 250, which are aligned in series. Additionally or alternatively, in some embodiments, any component with a closed flow area 320 may include a dedicated flow controller 270' so that the flow of process gas through that component can be controlled, for example, to provide additional or decreased cooling to one particular electrical component as compared to other electrical components.

Figure 9:
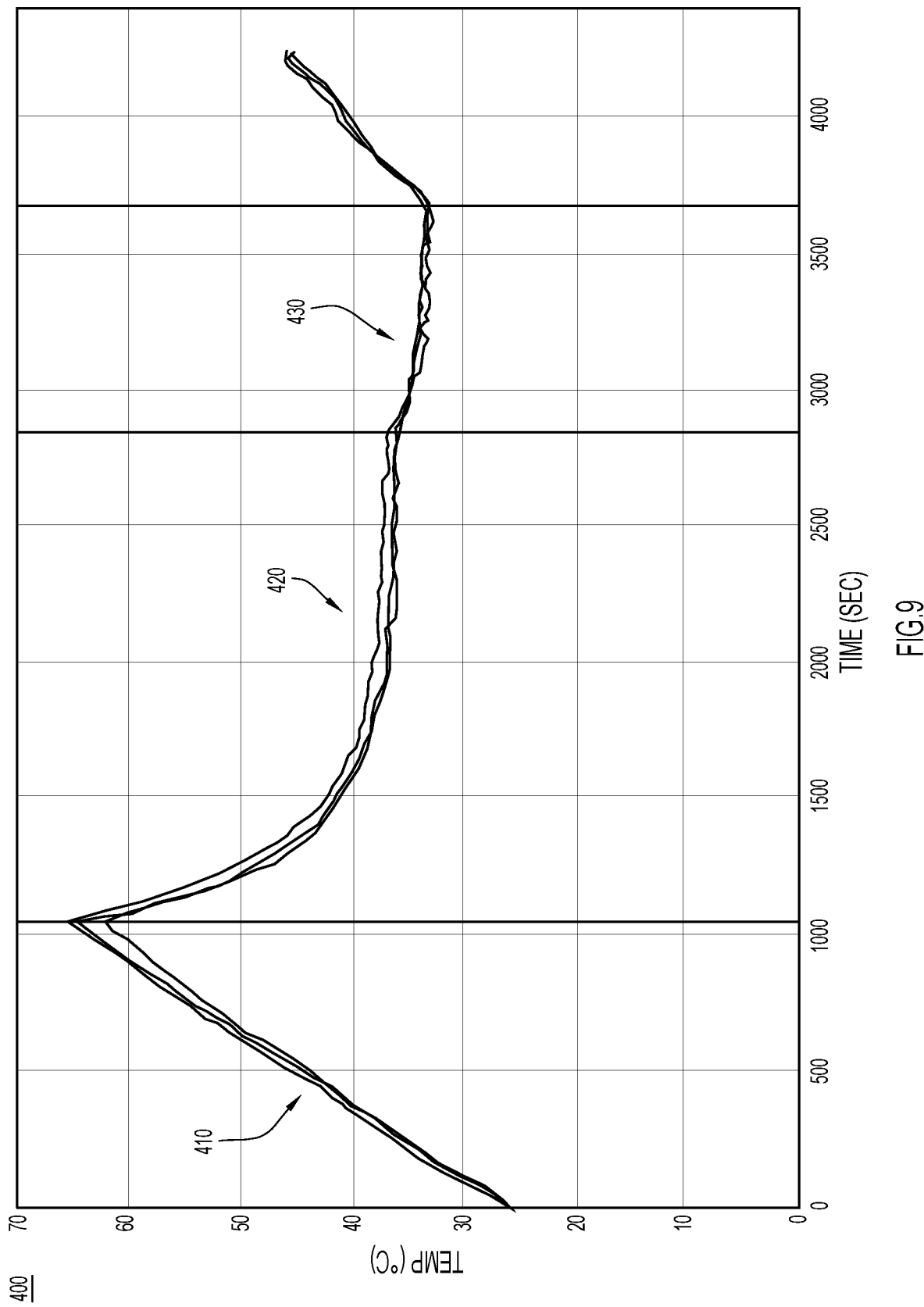
FIG. 9 is a diagram illustrating temperatures of electronic devices included in a power source when cooled with ambient air and when cooled with ambient air and the cooling configuration of the present disclosure.

Now turning to FIG. 9, this Figure is a diagram 400 illustrating temperatures of three electronic devices included in a power source when cooled with ambient air and when cooled with ambient air and the cooling configuration of the present disclosure. Initially, at stage 410, the temperature of each of each of the three electronic devices (each device is illustrated with a different line) rises due to natural convection during welding or cutting operations that require the three electrical devices to generate heat. Then, after approximately 1000 seconds of natural convection (e.g., when the electronic devices are all at or above approximately 60 degrees Celsius (° C.)), a fan is turned on to cool the three electronic devices with a forced subsonic flow of ambient air to begin a stage 420 of subsonic airflow cooling. The temperature of three electronic devices drops into a more suitable operational range (e.g., approximately 35-40° C.) over the span of approximately 1700-1900 seconds during stage 420. At stage 430, the cooling techniques presented herein are used together with the forced subsonic flow of ambient air and the temperature of three electronic devices drops further (e.g., to approximately 30-35° C.) over the span of about 700-900 seconds.

Figure 10:
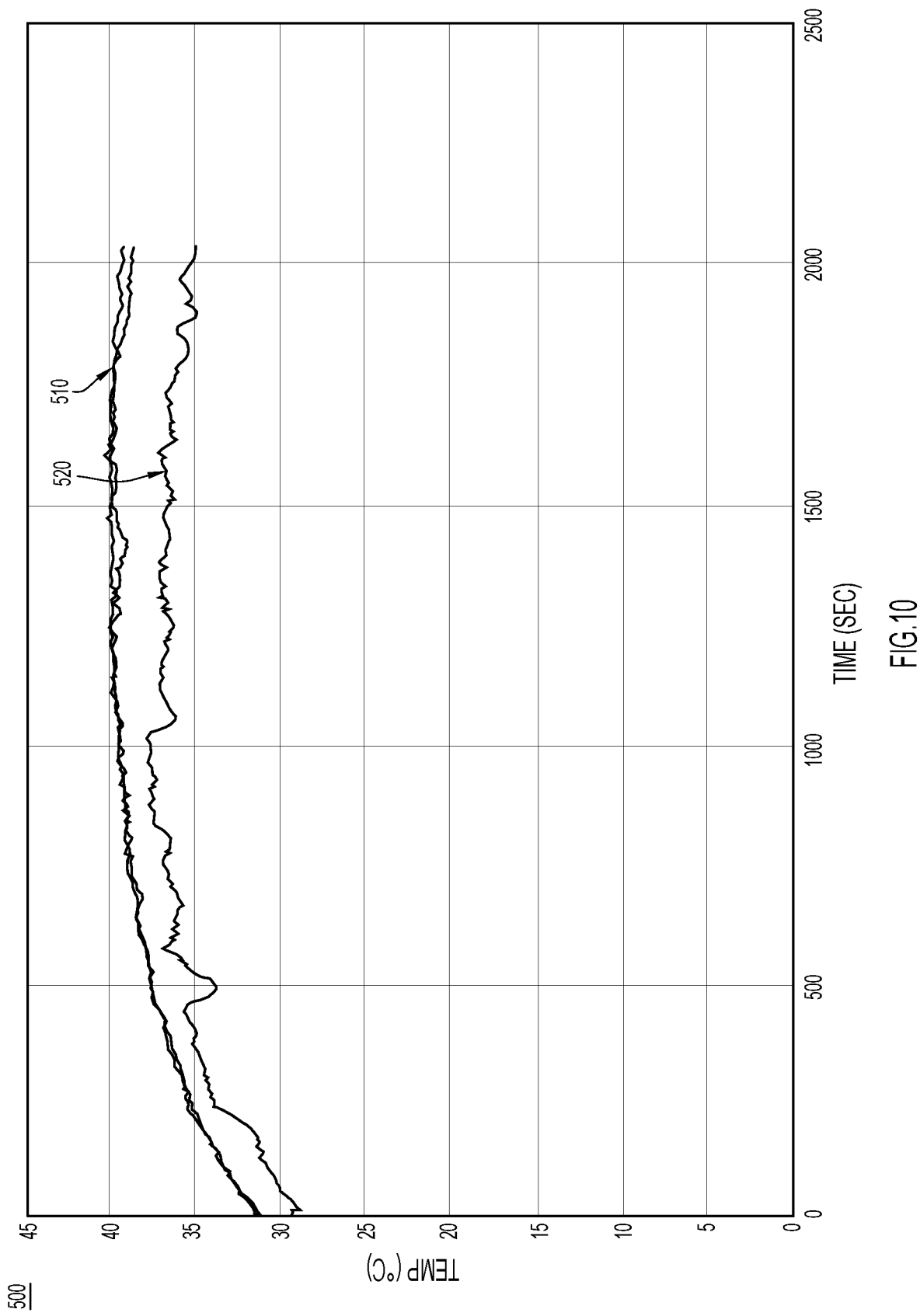
FIG. 10 is a diagram illustrating temperatures of electronic devices included in a power source when cooled with only the cooling configuration of the present disclosure.

FIG. 10 is a diagram 500 illustrating temperatures of two electronic devices included in a power source when cooled, during convection, with only the cooling configuration of the present disclosure. Notably, over the course of approximately 2000 seconds of convection and cooling with only the cooling techniques presented herein (e.g., process gas passing over/through heat transfer surfaces for the two electronic devices), both electronic devices remain at temperatures within a suitable operational range for electronic components (e.g., approximately 35-40° C.). More specifically, device 520 beings to settle into temperatures in the range of approximately 33-35° C. and device 510 beings to settle into temperatures in the range of approximately 36-38° C. Thus, when used alone, the cooling techniques presented herein may provide effective cooling that is at least as effective as the cooling provided with the forced subsonic flow of ambient air utilized in stage 420 of FIG. 9.

Moreover, notably, in FIG. 9, the electrical components experienced an initial stage without cooling and, then, a cooling stage was initiated to effectuate a drastic change in temperature (almost a 50% reduction in temperature). This method of cooling may create a number of unwanted issues. For example, to initiate a cooling stage, accurate temperature readings must be constantly monitored. If there is a failure in any portion of the temperature feedback process, the failure may delay or prevent initiation of a cooling stage and cause damage or unwanted wear for the electrical components. Moreover, cooling in stages allows the temperature to become relatively high before cooling begins and, thus, the cooling may require more time and more energy. By comparison, since the techniques presented herein utilize welding/cutting resources that are being supplied to a torch assembly to effectuate welding/cutting operations to provide cooling, the techniques presented herein will initiate when welding or cutting processes initiates Thus, the cooling provided by the techniques presented herein does not need to be activated by a feedback loop (thereby avoiding one pitfall typically associated with cooling). Additionally, the cooling provided by the techniques presented herein will prevent electrical components from rising to relatively high temperatures during an initial convection stage because there is no convection stage without cooling. Put simply, the techniques presented herein direct process gas through the closed gas flow path 280 during welding or cutting operations of the welding or cutting system.

Figure 11:
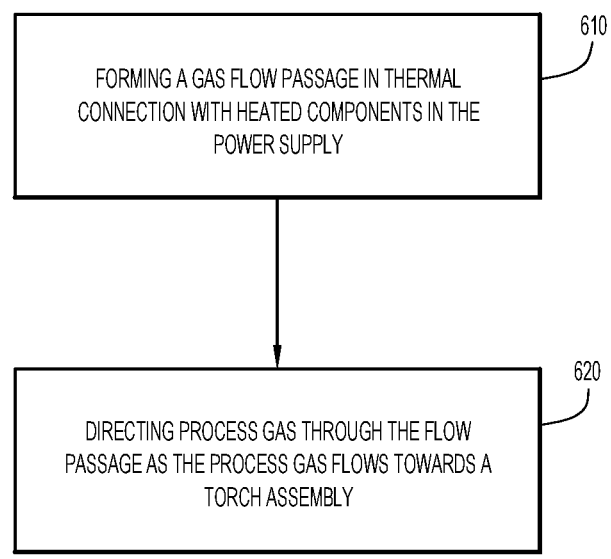
FIG. 11 is a high-level flow chart depicting a method for cooling a power source in accordance with the techniques presented herein.

FIG. 11 is a high-level flow chart depicting a method 600 for cooling a power source in accordance with the techniques presented herein. Initially, at 610, a gas flow passage is formed in thermal connection with heated components in the power source. For example, a gas flow passage (i.e., a gas flow area) may be formed in the base of a heat sink, over the fins of a heat sink, or on a surface of a heat sink (e.g., on the top of the base of a heat sink). In some embodiments, such as the embodiment shown in FIGS. 4, 5A, and 5B, the gas flow passage is formed by forming (e.g., machining) a cavity in a portion of a component (e.g., a heat sink) in thermal connection with heated components (e.g., electrical components). However, in other embodiments, such as the embodiment shown in FIGS. 6-8, the gas flow passage is formed by securing a cover to a portion of a component (e.g., a heat sink) in thermal connection with heated components (e.g., electrical components). The cover may or may not enclose heat transfer features (e.g., fins) of the component.

At 420, process gas is directed through the flow passage as the process gas flows towards a torch assembly. This may cause the process gas to transfer heat away from the component (e.g., a heat sink) in thermal connection with heated components (e.g., electrical components) which, in turn, may cool the heated components. Moreover, the transfer of heat may cause the process gas to rise in temperature as the process gas travels through the power source. For example, in one embodiment, process gas may enter the power source at approximately 23° C. and exit the power source at approximately 48° C. This change in temperature may provide significant cooling to electrical components in a power source and cool electrical components at least as effectively as typical forced subsonic airflows (as is demonstrated in FIGS. 9 and 10) and, thus the cooling configuration presented herein may provide a cooling solution that can replace typical forced subsonic airflow cooling solutions to create a lighter and/or cheaper power source. Moreover, this rise in temperature will typically not effect cutting or welding operations in which the process gas is involved. For example, process gas used as plasma gas may be heated to temperatures at or in excess of approximately 2000° C. to generate a stream of plasma, so altering the temperature of process gas delivered to the torch from approximately 23° C. to approximately 48° C. will have little impact on the generation of a stream of plasma.

To summarize, in one form a cooling component suitable for cooling an electrical component disposed in a power source of a welding or cutting system is presented herein, the cooling component comprising: a heat transfer surface for transferring heat away from the electrical component; an inlet for receiving process gas from a gas source; an outlet that directs the process gas downstream towards a torch assembly; a closed flow area extending between the inlet and the outlet, wherein the closed flow area is in thermal communication with the heat transfer surface so that the process gas enhances cooling of the electrical component as the process gas travels through the closed flow area, from the inlet to the outlet.

In another form, a power source for a welding or cutting system is presented herein, the power source comprising: an external housing; electrical components disposed within the external housing; and a cooling component positioned within the external housing in a position that receives heat generated by at least one of the electrical components, the cooling component comprising: an inlet for receiving process gas from a gas source; an outlet that directs the process gas downstream towards a torch assembly; and a closed flow area that direct the process gas from the inlet to the outlet so that the process gas enhances cooling of the at least one electrical component as the process gas travels through the closed flow area, from the inlet to the outlet.

In yet another form, a method of cooling components in a power source for a welding or cutting system is presented herein, the method comprising: forming a gas flow passage in thermal connection with heated components in the power source; and directing process gas through the flow passage as the process gas flows towards a torch assembly.

Although the techniques are illustrated and described herein as embodied in one or more specific examples, the specific details of the examples are not intended to limit the scope of the techniques presented herein, since various modifications and structural changes may be made within the scope and range of the invention. For example, a power source including a cooling configuration formed in accordance with the techniques presented herein may include any number of closed flow paths extending from a gas inlet to a gas outlet of a power source. As another example, a flow path may include any number of branches so that any number of components are incorporated into the flow path in series or in parallel. In addition, various features from one of the examples discussed herein may be incorporated into any other examples. Accordingly, the appended claims should be construed broadly and in a manner consistent with the scope of the disclosure.

I claim:

1. A cooling component suitable for cooling an electrical component disposed in a power source of a welding or cutting system, the cooling component comprising:
   a main body with a heat transfer surface for transferring heat away from an electrical component disposed in a power source of a welding or cutting system, the main body being disposed within and distinct from an enclosure of the power source of the welding or cutting system and defining:
   an inlet for receiving process gas from a gas source;
   an outlet that directs the process gas downstream towards a torch assembly; and
   a closed flow area extending between the inlet and the outlet within the main body, wherein the closed flow area is in thermal communication with the heat transfer surface so that the process gas enhances cooling of the electrical component as the process gas travels through the closed flow area, from the inlet to the outlet.

2. The cooling component of claim 1, wherein the process gas is plasma gas, the torch assembly is a plasma arc torch assembly, and when the plasma gas reaches the plasma arc torch assembly, the plasma gas is ionized to create a plasma stream.

3. The cooling component of claim 1, wherein the process gas is the only media flowing through the closed flow area.

4. The cooling component of claim 1, wherein cooling component further comprises:
   one or more fins disposed in the closed flow area, wherein the process gas travels over the one or more fins when flowing from the inlet to the outlet to enhance the cooling of the electrical component.

5. The cooling component of claim 1, wherein the main body of the cooling component comprises a heat sink including:
   a base; and
   heat sink fins that extend away from the base.

6. The cooling component of claim 5, wherein the closed flow area is formed in the base of the heat sink.

7. The cooling component of claim 6, wherein the closed flow area is formed in a cavity defined by the base, and the cooling component further comprises:
   a cover that seals the cavity to define the closed flow area.

8. The cooling component of claim 6, wherein the inlet and the outlet are formed in the base of the heat sink.

9. The cooling component of claim 5, wherein the closed flow area is formed by a cover that defines an internal volume with an outer surface of the base.

10. The cooling component of claim 9, wherein the cover and the base enclose at least one of the heat sink fins within the internal volume.

11. The cooling component of claim 9, wherein the inlet and the outlet are formed in the cover.

12. A power source for a welding or cutting system, comprising:
   an external housing;
   electrical components of the power source for the welding or cutting system disposed within the external housing of the power source for the welding or cutting system; and
   a cooling component that receives heat generated by at least one of the electrical components, the cooling component having a main body positioned within and distinct from the external housing comprising:
      an inlet for receiving process gas from a gas source;
      an outlet that directs the process gas downstream towards a torch assembly; and
      a closed flow area that direct the process gas from the inlet to the outlet so that the process gas enhances cooling of the at least one electrical component as the process gas travels through the closed flow area, from the inlet to the outlet.

13. The power source of claim 12, wherein the process gas is plasma gas, the torch assembly is a plasma arc torch assembly, and when the plasma gas reaches the plasma arc torch assembly, the plasma gas is ionized to create a plasma stream.

14. The power source of claim 12, wherein the process gas is the only media flowing through the closed flow area.

15. The power source of claim 12, wherein the cooling component comprises a heat sink including:
   a base; and
   heat sink fins that extend away from the base.

16. The power source of claim 12, wherein the external housing comprises:
   a housing outlet configured to receive the process gas from the outlet of the cooling component and deliver the process gas to the torch assembly.

17. The power source of claim 12, wherein the gas source is external to the power source, and the external housing further comprises:
   a housing inlet configured to receive the process gas from the gas source and deliver the process gas to the inlet of the cooling component.

18. A method of cooling components in a power source for a welding or cutting system, comprising:
   forming a gas flow passage through a main body of a heat transfer component disposed in and distinct from an enclosure of a power source for a welding or cutting system, the main body of the heat transfer component being in thermal connection with heated components in the power source for a welding or cutting system; and
   directing process gas through the flow passage as the process gas flows towards a torch assembly so that the heat transfer component transfers heat from the heated components to the process gas, heating the process gas and cooling the heated components, as the process gas flows towards the torch assembly.

19. The method of claim 18, wherein the process gas is plasma gas, the torch assembly is a plasma arc torch assembly, and when the plasma gas reaches the plasma arc torch assembly, the plasma gas is ionized to create a plasma stream.

20. The method of claim 18, wherein the directing occurs during welding or cutting operations of the welding or cutting system.

* * * * *